(12) United States Patent
Li (10) Patent No.: US 11,842,767 B2
(45) Date of Patent: Dec. 12, 2023

(54) MEMORY DEVICE AND OPERATION METHOD THEREOF

(71) Applicant: Shanghai Zhaoxin Semiconductor Co., Ltd., Shanghai (CN)

(72) Inventor: Quansheng Li, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 45 days.

(21) Appl. No.: 17/082,477

(22) Filed: Oct. 28, 2020

(65) Prior Publication Data

US 2021/0407586 A1 Dec. 30, 2021

(30) Foreign Application Priority Data

Jun. 29, 2020 (CN) .......................... 202010608058.X (51) Int. Cl.
*G11C 11/418* (2006.01)
*G11C 11/412* (2006.01)
*G11C 11/419* (2006.01)

(52) U.S. Cl.
CPC .......... *G11C 11/418* (2013.01); *G11C 11/412* (2013.01); *G11C 11/419* (2013.01)

(58) Field of Classification Search
CPC .... G11C 11/418; G11C 11/419; G11C 11/412
USPC ........................................................ 365/156
See application file for complete search history.

(56) References Cited

U.S. PATENT DOCUMENTS

| 5,263,002 A | 11/1993 | Suzuki et al. | |
| 5,359,572 A | 10/1994 | Sato et al. | |
| 5,917,770 A * | 6/1999 | Tanaka | G11C 8/10 365/230.01 |
| 2001/0024384 A1* | 9/2001 | Arimoto | G11C 29/50 365/200 |
| 2004/0095836 A1 | 5/2004 | Choi et al. | |
| 2007/0258312 A1* | 11/2007 | Richards | H04N 9/3123 365/230.03 |
| 2011/0242882 A1* | 10/2011 | Asayama | H10B 10/12 365/154 |
| 2017/0213587 A1* | 7/2017 | Gupta | G11C 8/08 |

(Continued)

FOREIGN PATENT DOCUMENTS

| CN | 103106918 A | 5/2013 |
| WO | 2017/208014 A1 | 12/2017 |

OTHER PUBLICATIONS

Chinese language office action dated Dec. 30, 2021, issued in application No. CN 202010608058.X.

*Primary Examiner* — Sung Il Cho
(74) *Attorney, Agent, or Firm* — McClure, Qualey & Rodack, LLP (57) ABSTRACT

A memory device and an operation method for the memory device are provided. The memory device includes a memory block, a row decoder and a control circuit. The memory block includes a plurality of memory cells, wherein a row of memory cells in the memory block are coupled to at least one word line, and a column of memory cells in the memory block are coupled to a bit line and a multiplexer. The row decoder is coupled to the memory block and configured for the row of memory cells. The control circuit is coupled to the row decoder and indicates which word line, bit line and multiplexer is enabled.

8 Claims, 10 Drawing Sheets

(56) References Cited

U.S. PATENT DOCUMENTS

2020/0185014 A1* 6/2020 Chen ................... G11C 8/10
2020/0342940 A1* 10/2020 Roy .................... G11C 29/025

* cited by examiner

MEMORY DEVICE AND OPERATION METHOD THEREOF

CROSS REFERENCE TO RELATED APPLICATIONS

This application claims priority of China Patent Application No. 202010608058.X filed on Jun. 29, 2020, the entirety of which is incorporated by reference herein.

BACKGROUND OF THE INVENTION

Field of the Invention

The invention generally relates to a memory device technology, and more particularly, relates to a memory device technology in which at least one word line is configured for each memory cell of a memory array.

Description of the Related Art

For the design of the Static Random Access Memory (SRAM), if the memory array includes too many rows of memory cells, i.e. too many memory cells are configured in one column, due to the infection of the parasitic capacitances, the loading of the bit lines will be excessive. Therefore, for the design of SRAM, a column of memory cells will be configured in rows and columns, e.g. the column of memory cells will be divided into two columns, four columns, or eight columns.

BRIEF SUMMARY OF THE INVENTION

A memory device and an operation method thereof are provided to overcome the aforementioned problems.

An embodiment of the invention provides a memory device. The memory device comprises a memory block, a row decoder and a control circuit. The memory block comprises a plurality of memory cells, a row of the plurality of memory cells are coupled to at least one word line, and a column of the plurality of memory cells are coupled to a bit line and a multiplexer. The row decoder is coupled to the memory block to serve the row of the plurality of memory cells. The control circuit is coupled to the row decoder to indicate which word line, bit line and multiplexer are enabled.

An embodiment of the invention provides an operation method for a memory device. A memory block of the memory device comprises a plurality of memory cells. A row of the plurality of memory cells is coupled to at least one word line. A column of the plurality of memory cells is coupled to a bit line and a multiplexer. The operation method comprises the following steps. When a read operation or a write operation needs to be performed on a first memory cell of the row of the plurality of memory cells, enabling a first word line coupled to the first memory cell; discharging the bit line coupled to the first memory cell; selecting the multiplexer corresponding to the first memory cell; and performing the read operation or the write operation on the first memory cell.

Other aspects and features of the invention will become apparent to those with ordinary skill in the art upon review of the following descriptions of specific embodiments of memory device and operation method of memory device.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
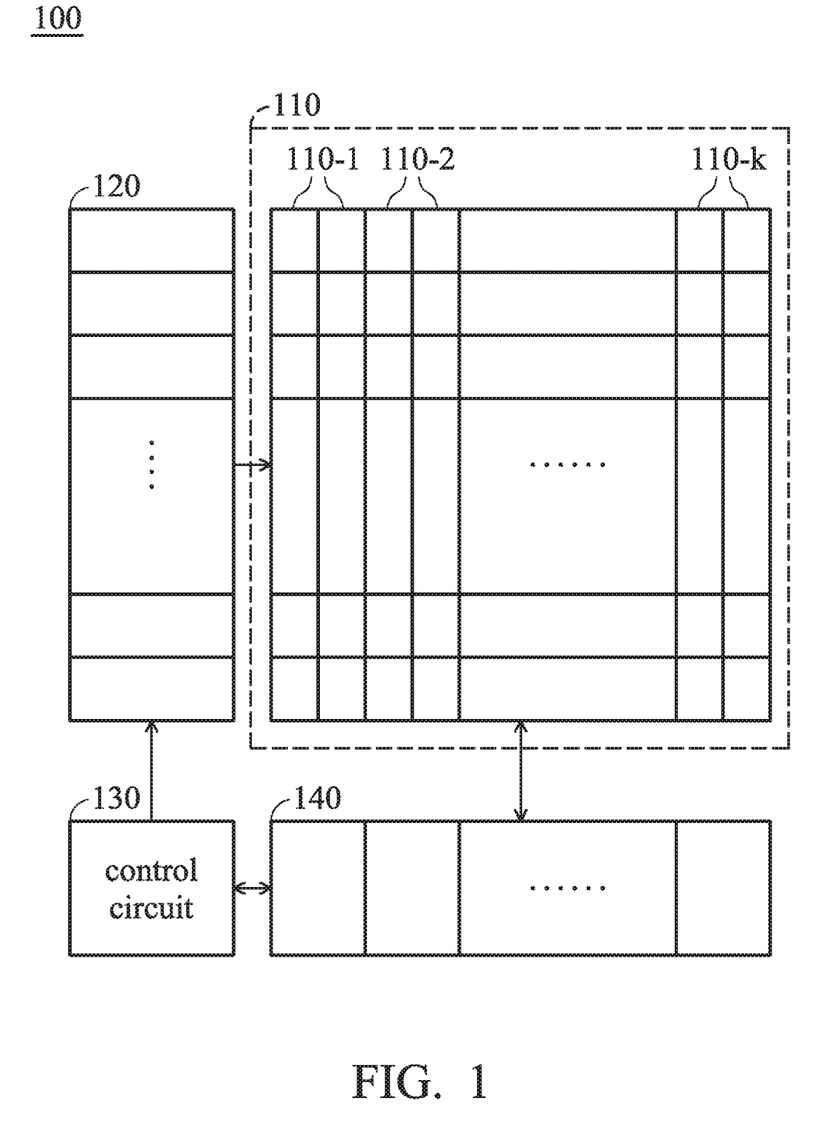
FIG. 1 is a block diagram of a memory device 100 according to an embodiment of the invention.

FIG. 1 is a block diagram of a memory device 100 according to an embodiment of the invention. According to an embodiment of the invention, the memory device 100 may be a Static Random Access Memory (SRAM). As shown in FIG. 1, the memory device 100 comprises a memory array 110, a row decode circuit 120, a control circuit 130 and an input/output circuit 140. It should be noted that the block diagram shown in FIG. 1 is only used to illustrate the embodiments of the invention, but the invention should not be limited thereto.

As shown in FIG. 1, in the embodiments of the invention, the memory array 110 comprises a plurality of memory cells. These memory cells are arranged by n columns and are divided into k memory blocks 110-1~110-k. Each memory block of the memory blocks 110-1~110-k corresponds to the operations of reading and writing a bit data. In the embodiments of the invention, corresponding to each of the memory blocks 110-1~110-k, the input/output circuit 140 correspondingly comprises k input/output interfaces, herein k=n/i, and i is an integer exponent of 2 which presents the number of columns of each memory block of the memory blocks 110-1~**110-*k*. In FIG. 1, i=2 is taken as an example, but obviously, the invention should not be limited thereto. In the embodiments of the invention, the memory cells are also arranged by m rows, corresponding to each row of memory cells, the row decode circuit 120** comprises m row decoders. According to a better embodiment of the invention, the closer the m and n are the better the arrangement of the memory cells is.

Each column of memory cells in each of the memory blocks (e.g. memory blocks 110-1~**110-*k* as shown in FIG. 1) are configured to have a multiplexer, a bit line and an inverted bit line. The bit lines of the memory cells in the same column are connected together and the inverted bit lines of the plurality of memory cells in the same column are also connected together, so as to connect each column of memory cells to a corresponding input/output interface of the input/output circuit 140 through the multiplexer configured for the column of the plurality of memory cells. Each row of memory cells in memory array 110** are configured to have at least one word line. In order to correspond to the at least one word line, the row decoder configured for each row of memory cells comprises at least one sub decoder. That is to say, in some embodiments of the invention, a row of memory cells may be allocated different word lines. For example, a part of memory cells in a row may be allocated a word line, and the another part of memory cells in the row may be allocated another word line. At the same time, the number of sub decoders in the row decoder corresponding to the row of the memory cells is greater than or equal to the number of word lines allocated to the row of the memory cells. That is to say, if one more word line is allocated to a row of the memory cells, at least one more sub decoder needs to be allocated to the row decoder corresponding to the row of the memory cells.

Figure 2:
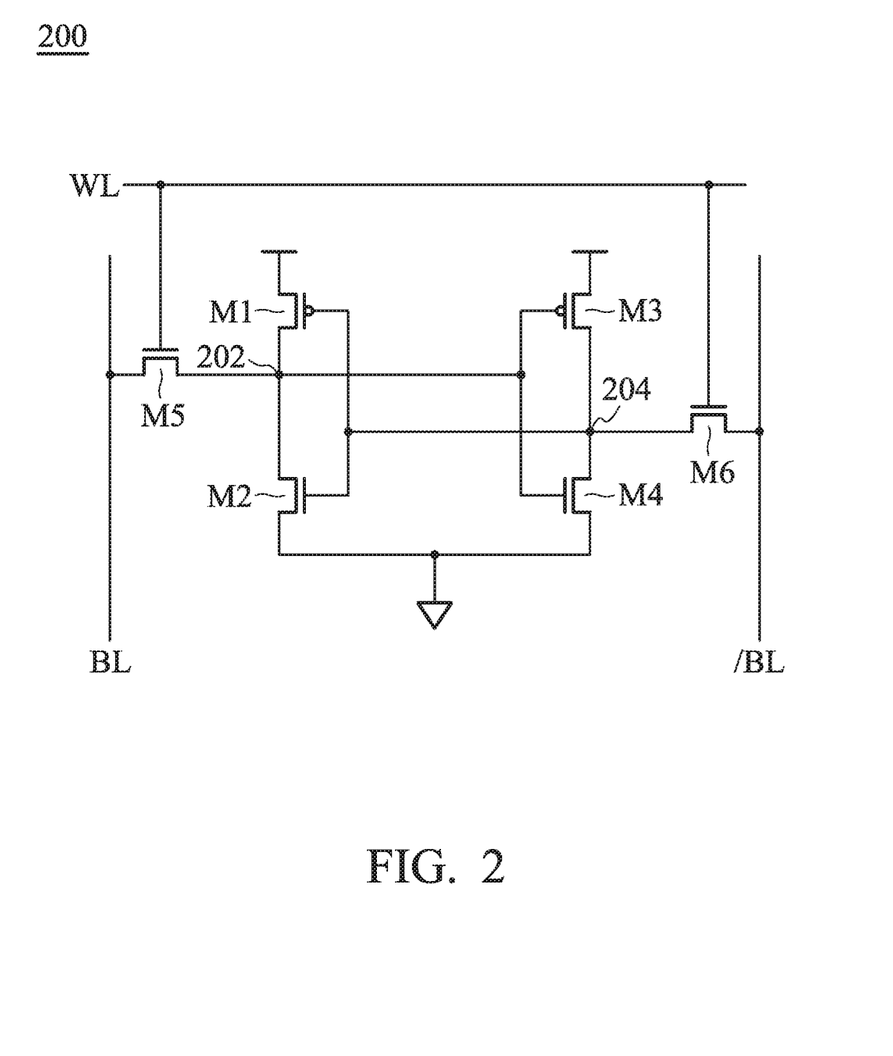
FIG. 2 is a schematic diagram of a memory cell 200 according to an embodiment of the invention.

FIG. 2 is a schematic diagram of a memory cell 200 according to an embodiment of the invention. The memory cell 200 is one of the memory cells in the memory array 110. As shown in FIG. 2, the memory cell 200 comprises a first transistor M1, a second transistor M2, a third transistor M3, a fourth transistor M4, a fifth transistor M5 and a sixth transistor M6. The first transistor M1 and the second transistor form a first inverter 210, and the third transistor M3 and the fourth transistor M4 form a second inverter 220. The first inverter 210 and the second inverter 220 are cross-coupled with each other to form a bistable circuit. The first transistor M1 and the third transistor M3 are PMOS transistors, and can be regarded as load transistors. The second transistor M2 and the fourth transistor M4 are NMOS transistors and can be regarded as driver transistors. The fifth transistor M5 and the sixth transistor M6 are NMOS transistors, and can be regarded as transmission transistors. The memory cell 200 is connected to external elements (e.g. bit line BL, inverted bit line /BL and word line WL) through the fifth transistor M5 and the sixth transistor M6. The read operation and the write operation are performed to the memory cell 200 through the fifth transistor M5 and the sixth transistor M6. When the read operation is performed to the memory cell 200, the bit line BL and the inverted bit line /BL are charged to a power voltage in advance. When the fifth transistor M5 and the sixth transistor M6 are enabled, the third transistor M3 or the fourth transistor M4 discharges for the electric charges stored in the bit line BL or the inverted bit line /BL to generate a voltage difference between the bit line BL and the inverted bit line /BL. Then, a sensitive amplifier (not shown in figures) of the input/output interface corresponding to the memory cell 200 receives the voltage difference, and reads out the voltage difference as a data.

When the write operation is performed to the memory cell 200, the bit line BL and the inverted bit line /BL are charged to the power voltage in advance, and a driver circuit (not shown in figures) of the input/output interface corresponding to the memory cell 200 may pull down the electric potential of the bit line BL or the inverted bit line /BL to 0 first in the write period. Then, when the fifth transistor M5 and the sixth transistor M6 are enabled, the method of driving the voltage inversion of the node 202 or node 204 is used to write the data into the memory cell 200 through the bit line BL and the inverted bit line /BL.

According to an embodiment of the invention, for each row of memory cells of each memory block in the same memory array, the adjacent memory cells may be connected to a word line. That is to say, the memory cells in the same row in a memory block may be connected to the same word line. When the read operation or write operation is performed to one of the memory cells in the row, the word line is enabled. The bit line BL or the inverted bit line /BL corresponding to each memory cell in the row discharges through the transmission transistor (e.g. the fifth transistor M5 or the sixth transistor M6 in FIG. 2) and the driver transistor (e.g. the second transistor M2 or the fourth transistor M4 in FIG. 2).

Figure 3A:
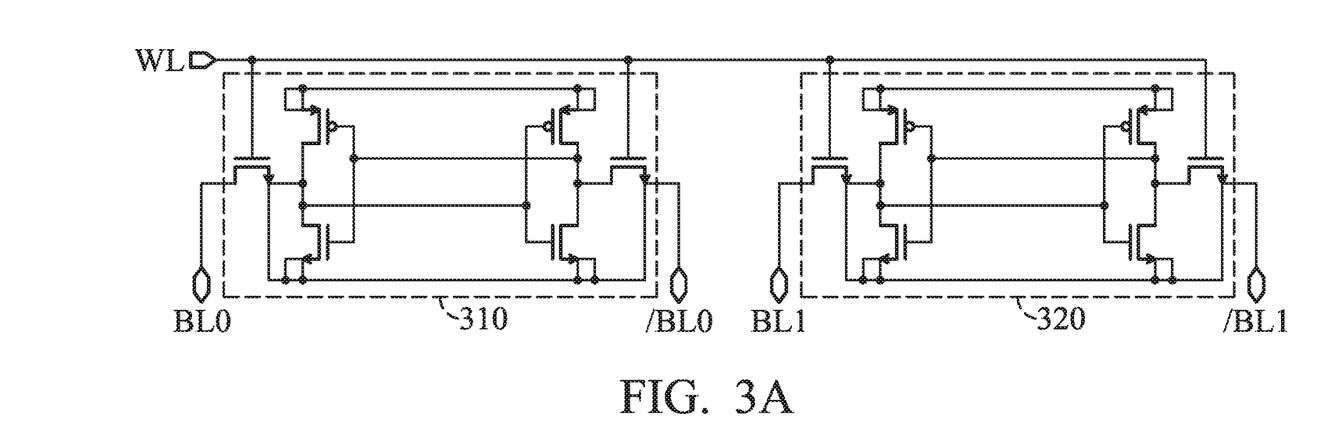
FIG. 3A is a schematic diagram of the adjacent memory cells in the same row connecting to a word line according to an embodiment of the invention.

FIG. 3A is a schematic diagram of the adjacent memory cells in the same row in a memory block connecting to a word line according to an embodiment of the invention. The structures of memory cell 310 and the memory cell 320 in FIG. 3A can be regarded the same as the structure of the memory cell 200. As shown in FIG. 3A, the memory cell 310 and the memory cell 320 share a word line WL. When the read operation or write operation is performed to the memory cell 310 or the memory cell 320, the word line WL is enabled, the bit line BL or the inverted bit line /BL corresponding to the memory cell 310 and the bit line BL or the inverted bit line /BL corresponding to the memory cell 320 need to perform the discharge operation.

According to another embodiment of the invention, for each row of memory cells of each memory block in the same memory array, the adjacent memory cells may be connected to different word lines. That is to say, the memory cells in the same row in a memory block may be connected to different word lines.

Figure 3B:
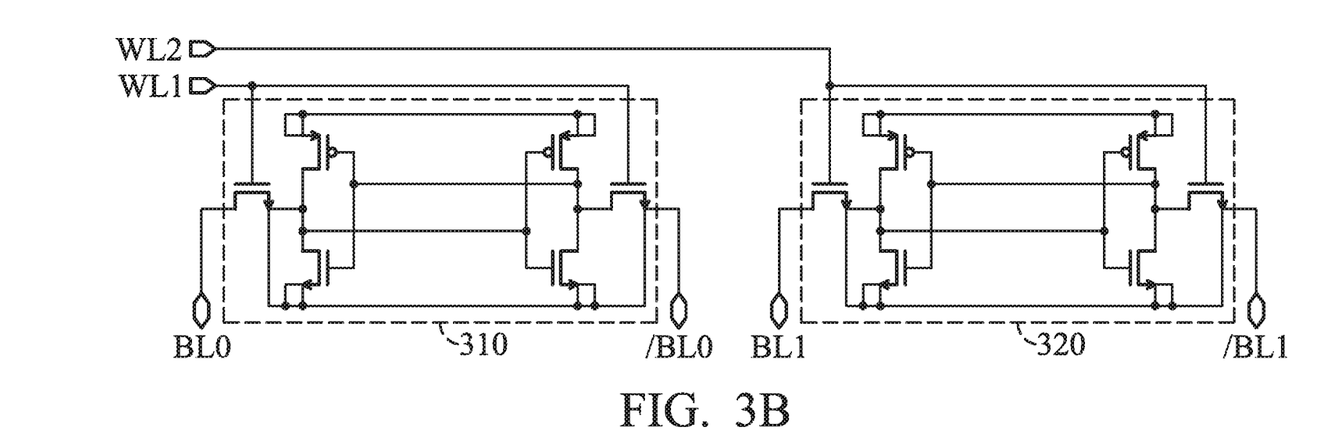
FIG. 3B is a schematic diagram of the adjacent memory cells in the same row connecting to different word lines according to an embodiment of the invention.

FIG. 3B is a schematic diagram of the adjacent memory cells in the same row in a memory block connecting to different word lines according to an embodiment of the invention. The structures of memory cell 310 and the memory cell 320 in FIG. 3B can be regarded the same as the structure of the memory cell 200. As shown in FIG. 3B, the memory cell 310 and the memory cell 320 use the word line WL1 and the word line WL2 respectively. In the embodiment of FIG. 3A, the memory cell 310 and the memory cell 320 share the same word line WL, so that when the read operation or the write operation is performed to the memory cell 310 or the memory cell 320, the bit line BL or the inverted bit line /BL corresponding to the memory cell 310 and the bit line BL or the inverted bit line /BL corresponding to the memory cell 320 both need to perform the discharge operation. However, in the embodiment of FIG. 3B, when the read operation or the write operation is performed to the memory cell 310 or the memory cell 320, only the word line WL1 or the word line WL2 need to be enabled, and only the bit line BL or the inverted bit line /BL corresponding to the memory cell 310, or the bit line BL or the inverted bit line /BL corresponding to the memory cell 320 needs to perform the discharge operation. Therefore, when the memory cell 310 and the memory cell 320 use the word line WL1 and word line WL2 respectively, the power consumption of the memory device 100 will be reduced. It should be noted that in FIG. 3B, two memory cells and two word lines are taken as an example, but the invention should not be limited thereto. The method of FIG. 3B also can be applied to other number of memory cells (in the same row) and other number of word lines.

Figure 4A:
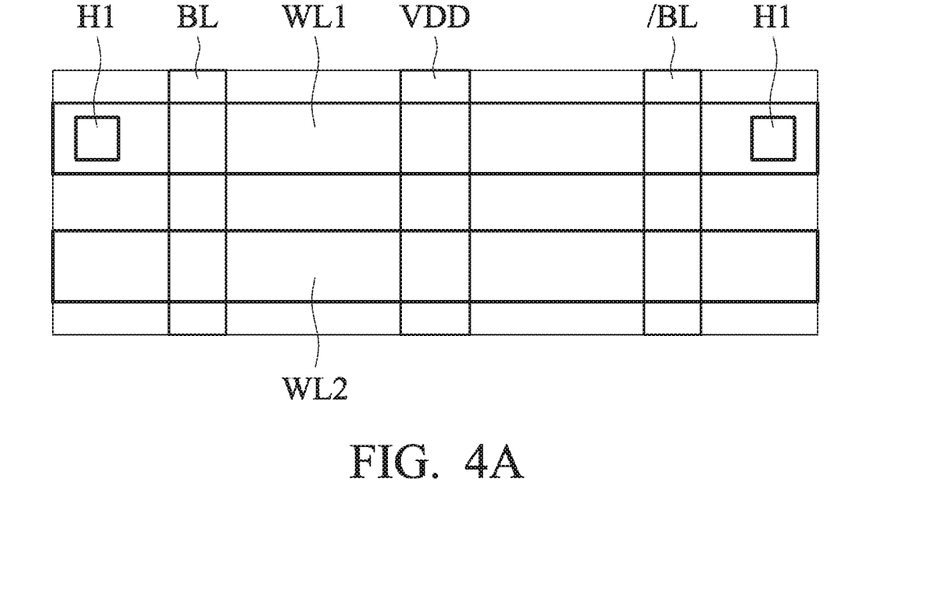
FIG. 4A is a schematic diagram of the word lines corresponding to the memory cells according to an embodiment of the invention.
Figure 4B:
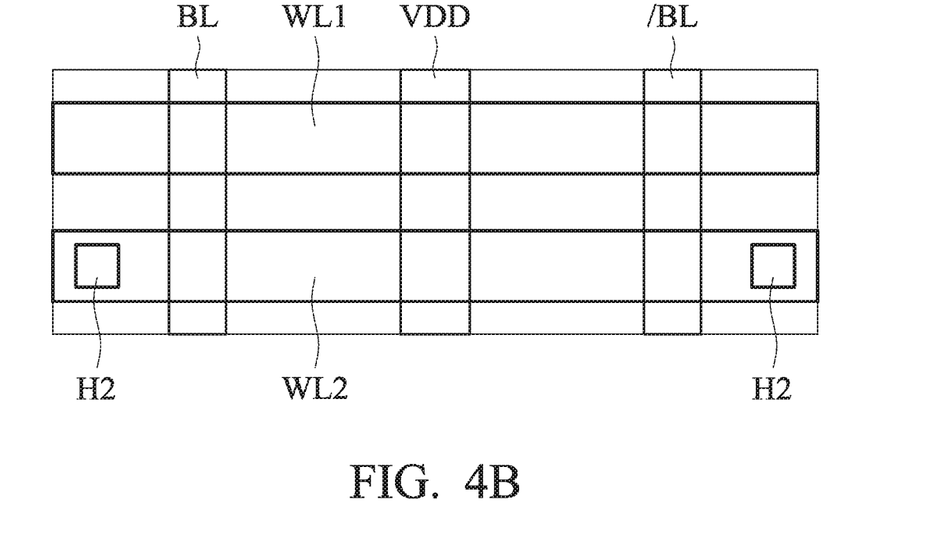
FIG. 4B is a schematic diagram of the word lines corresponding to the memory cells according to another embodiment of the invention.
Figure 5:
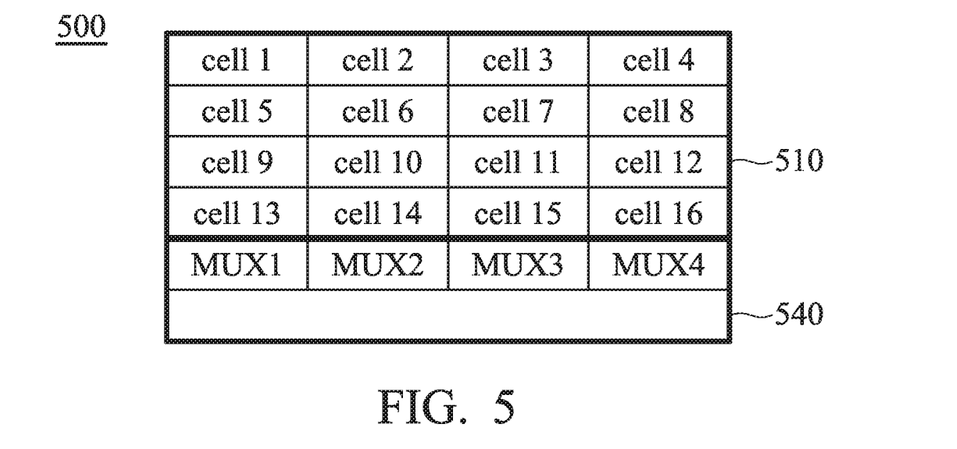
FIG. 5 is a schematic diagram of a memory block and its corresponding input/output interface according to an embodiment of the invention.

According to an embodiment of the invention, the arrangements and whether be configured with holes of the word lines corresponding to a row of memory cells in a memory block may be different. FIG. 4A is a schematic diagram of the word lines corresponding to the memory cells according to an embodiment of the invention. As shown in FIG. 4A, according to an embodiment of the invention, a row of memory cells correspond to the word lines WL1 and WL2, herein the word line WL1 is connected to the base line(s) of the base layer through the hole H1 and the word line WL2 comprises no hole. FIG. 4B is a schematic diagram of the word lines corresponding to the memory cells according to another embodiment of the invention. As shown in FIG. 4B, according to an embodiment of the invention, a row of memory cells correspond to the word lines WL1 and WL2, herein the word line WL2 is connected to the base line(s) of the base layer through the hole H2 and the word line WL1 comprises no hole. The word lines shown in FIG. 4A and the word lines shown FIG. 4B may be arranged in the memory block in a spacing way, so that the word line WL1 is configured for the first part of the memory cells in the memory block and the word line WL2 is configured for the second part of the memory cells in the memory block. FIG. 5 is used to illustrate below.

FIG. 5 is a schematic diagram of a memory block and its corresponding input/output interface according to an embodiment of the invention. As shown in FIG. 5, the memory block 510 comprises memory cells cell 1~cell 16, and the memory block 510 corresponds to the input/output interface 540, herein corresponding to each column of memory cells, the input/output interface 540 comprises multiplexers MUX1~MUX4. Each column of memory cells in memory block 510 may be allocated a corresponding multiplexer. For example, the memory cells cell 2, cell 6, cell 10 and cell 14 in the second column correspond to the multiplexer MUX2. It should be noted that the schematic diagram shown in FIG. 5 is only used to illustrate the embodiment of the invention, but the invention should not be limited thereto. The memory device 500 may also comprise other number of memory cells and other elements.

Taking FIG. 5 as an example, if the word line WL1 shown in FIG. 4A is assigned to the memory cells cell 1 and cell 3 in the first row of the memory block 510, and the word line WL2 shown in FIG. 4B is assigned to the memory cells cell 2 and cell 4 in the first row of the memory block 510, when the read operation or the write operation needs to be performed to the memory cell cell 1 in the first row of the memory block 510, only the word line WL1 needs to be enabled, and when the read operation or the write operation needs to be performed to the memory cell cell 2 in the first row of the memory block 510, only the word line WL2 needs to be enabled. In addition, when the read operation or the write operation needs to be performed to the memory cell cell 1 in the first row of the memory block 510, only the bit lines corresponding to the memory cells cell 1 and cell 3 need to perform the discharge operation, the bit lines corresponding to the memory cells cell 2 and cell 4 do not need to perform the discharge operation.

Taking FIG. 5 as an example, if the word line WL1 shown in FIG. 4A is assigned to the memory cells cell 1 and cell 2 in the first row of the memory block 510, and the word line WL2 shown in FIG. 4B is assigned to the memory cells cell 3 and cell 4 in the first row of the memory block 510, when the read operation or the write operation needs to be performed to the memory cell cell 1 in the first row of the memory block 510, only the word line WL1 needs to be enabled, and when the read operation or the write operation needs to be performed to the memory cell cell 3 in the first row of the memory block 510, only the word line WL2 needs to be enabled. In addition, when the read operation or the write operation needs to be performed to the memory cell cell 1 in the first row of the memory block 510, only the bit lines corresponding to the memory cells cell 1 and cell 2 need to perform the discharge operation, the bit lines corresponding to the memory cells cell 3 and cell 4 does not need to perform the discharge operation.

Therefore, the power consumption of memory block 510 will be reduced. It should be noted that the schematic diagram shown in FIG. 5 is only used to illustrate the embodiment of the invention, but the invention should not be limited thereto.

Figure 6:
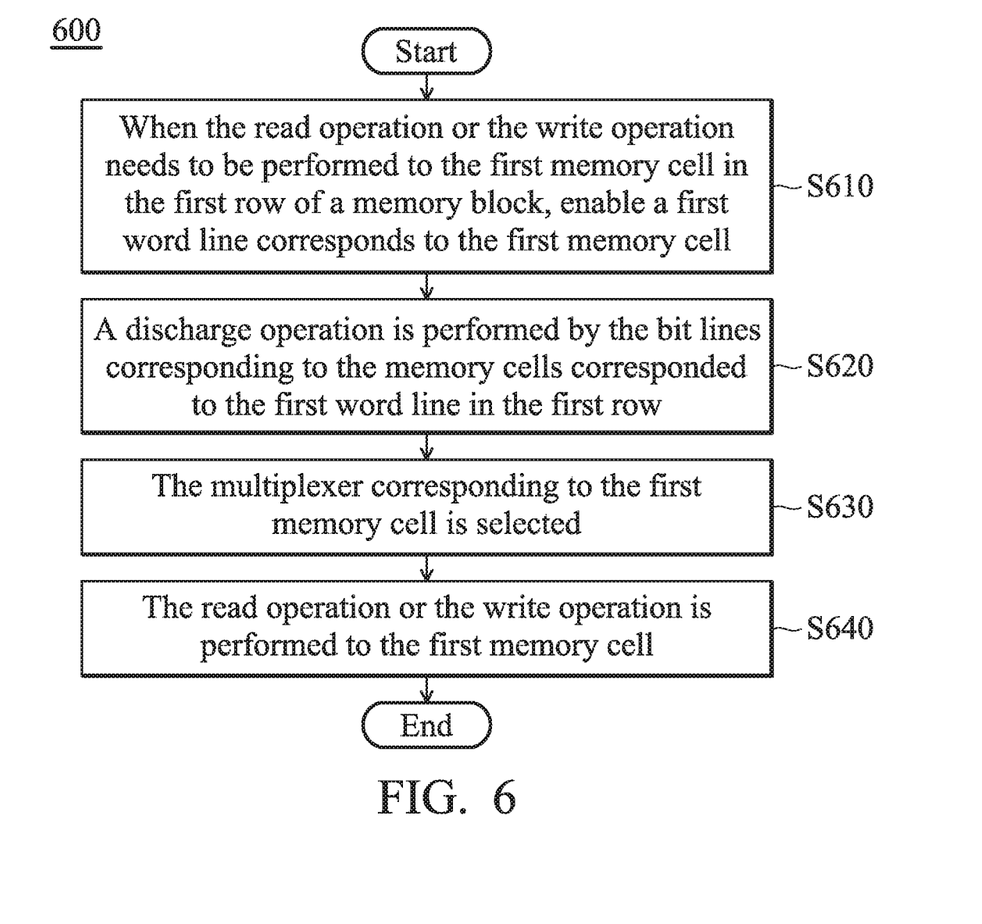
FIG. 6 is a flow chart illustrating operation method of the memory block according to an embodiment of the invention.

FIG. 6 is a flow chart illustrating operation method of the memory block according to an embodiment of the invention. The operation method of the memory block can be applied in the memory block arranged in m rows and i columns, e.g. the memory blocks of the memory array 110. As shown in FIG. 6, in step S610, when the read operation or the write operation needs to be performed to the first memory cell in the first row of a memory block, only enable a first word line corresponding to the first memory cell. Synchronize with Step 610, in step S620, the discharge operation is performed by the bit lines corresponding to the memory cells corresponded to the first word line in the first row. In step S630, the multiplexer corresponding to the first memory cell is selected. In step S640, the read operation or the write operation is performed to the first memory cell.

According to an embodiment of the invention, each row of memory cells in the same memory array may be configured with the same at least one word line. Taking memory array 110 as an example, the memory cells in a row may correspond to different memory blocks, but only one row decoder needs to be configured. Each row decoder of the row decode circuit 120 is coupled to the control circuit 130 and a word line of a row corresponding to the row decoder. When the read operation or the write operation needs to be performed to some memory cells in a row of the memory array 110, the control circuit 130 transmits pre-decode signals to the row decoder corresponding to these memory cells to enable the word line(s) corresponding to these memory cells. According to an embodiment of the invention, when memory cells in the row are coupled to a word line, the row decoder corresponding to the memory cells in the row comprises a sub decoder to enable the word line.

Figure 7A:
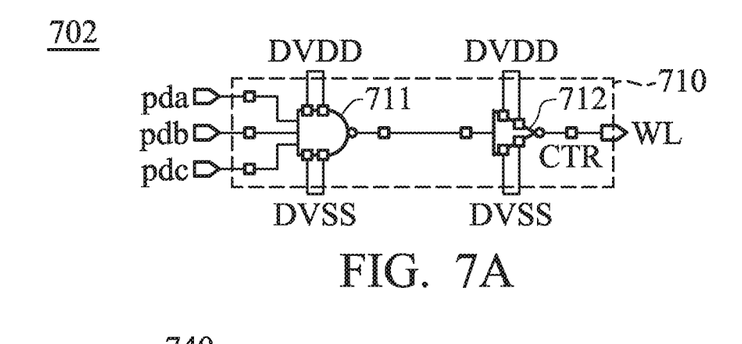
FIG. 7A is a schematic diagram of a row decoder configured for memory cells in a row according to an embodiment of the invention.

FIG. 7A is a schematic diagram of a row decoder when a row of memory cells of a memory array is coupled to a word line according to an embodiment of the invention. As shown in FIG. 7A, when only one word line WL is configured for the row of memory cells, a row decoder 702 is configured to the row of memory cells. The row decoder 702 comprises a sub decoder 710. The sub decoder 710 comprises a NAND gate 711 and a NOT gate (or inverter) 712. The input end of the NAND gate 711 receives the pre-decode signals pda, pdb and pdc from the control circuit 130. The NAND gate 711 performs NAND operation for the pre-decode signals pda, pdb and pdc, takes the operation result as an output signal and outputs the output signal to the NOT gate (or inverter) 712. The NOT gate (or inverter) 712 is coupled to the NAND gate 711, and the input end of NOT gate (or inverter) 712 receives the output signal of the NAND gate 711. The NOT gate (or inverter) 712 performs NOT operation for the output signal of the NAND gate 711 to generate a control signal CTR, and transmits the control signal CTR to the coupled word line WL to determine whether enable the word line WL. According to an embodiment of the invention, the NAND gate 711 and the NOT gate (or inverter) 712 are coupled to a power voltage DVDD and a ground voltage DVSS.

Figure 7B:
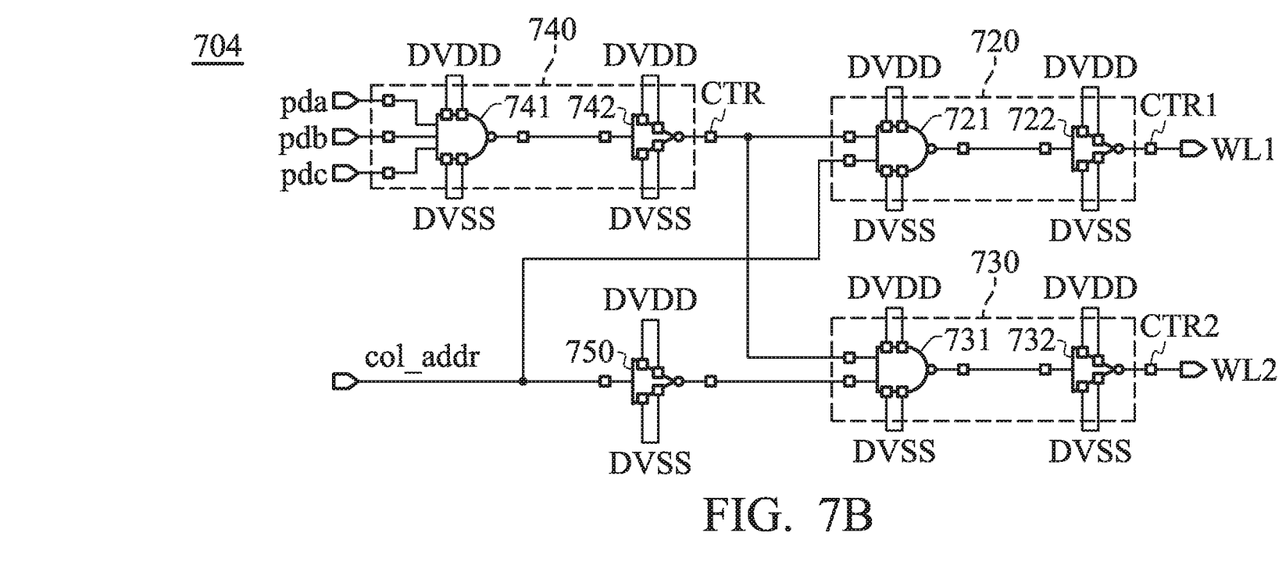
FIG. 7B is a schematic diagram of row decoders configured for memory cells in a row according to an embodiment of the invention.

According to another embodiment, when more than one word line is configured for a row of memory cells of a memory array, the row decoder corresponding to the row may comprise more than one sub decoders to respectively enable the word lines, herein the number of the sub decoders is the same as the number of word lines. FIG. 7B is a schematic diagram of a row decoder when a row of memory cells of a memory array are coupled to two word lines according to an embodiment of the invention. As shown in FIG. 7B, when the word lines WL1 and WL2 are configured for the row of memory cells, the row decoder 704 may comprise a sub decoder 720 and a sub decoder 730 to enable the word lines WL1 and WL2 respectively. The row decoder 704 further comprise a sub decoder 740 and a NOT gate 750 to enable the sub decoder 720 and the sub decoder 730.

The sub decoder 740 comprises a NAND gate 741 and a NOT gate (or inverter) 742. The NAND gate 741 receives the pre-decode signals pda, pdb and pdc from the control circuit 130. The NAND gate 741 performs the NAND operation on the pre-decode signals pda, pdb and pdc, and transmits the operation result to the NOT gate (or inverter) 742. The NOT gate (or inverter) 742 receives the output signal of the NAND gate 741 and performs a NOT operation on the output signal to generate a control signal CTR. Then, the NOT gate (or inverter) 742 outputs the control signal CTR to the sub decoder 720 and the sub decoder 730 to determine whether to enable the sub decoder 720 and/or the sub decoder 730 according to the control signal CTR, herein the sub decoder 720 and the sub decoder 730 are coupled to the output end of the NOT gate (or inverter) 742.

The NOT gate 750 receives an address signal col_addr from the control circuit 130, and the NOT gate 750 performs the NOT operation on the address signal col_addr to generate an inverse address signal col_addrB. Then, the NOT gate 750 outputs the inverse address signal col_addrB to the sub decoder 730, herein the sub decoder 730 is coupled to the output end of the NOT gate 750.

The sub decoder 720 comprises a NAND gate 721 and a NOT gate (or inverter) 722. The NAND gate 721 is coupled to the sub decoder 740 to receive the control signal CTR. Further, NAND gate 721 receives the address signal col_addr. The NAND gate 721 performs a NAND operation on the control signal CTR and the address signal col_addr and outputs the operation result to the NOT gate (or inverter) 722. The NOT gate (or inverter) 722 is coupled to the output end of the NAND gate 721 to receive the operation result of the NAND gate 721, and performs the NOT operation on the operation result of the NAND gate 721 to generate a first control signal CTR1. Then, the NOT gate (or inverter) 722 transmits the first control signal CTR1 to the coupled word line WL1 to determine whether enable the word line WL1 according to the first control signal CTR1.

The sub decoder 730 comprises a NAND gate 731 and a NOT gate (or inverter) 732. The NAND gate 731 is coupled to the output end of the sub decoder 740 to receive the control signal CTR. The NAND gate 731 is coupled to the output end of the NOT gate 750 to receive the inverse address signal col_addrB. The NAND gate 731 performs a NAND operation on the control signal CTR and the inverse address signal col_addrB and outputs the operation result to the NOT gate (or inverter) 732. The NOT gate (or inverter) 732 is coupled to the output end of the NAND gate 731 to receive the operation result of the NAND gate 731. The NOT gate (or inverter) 732 performs the NOT operation on the operation result of the NAND gate 731 to generate a second control signal CTR2 and outputs the second control signal CTR2 to the coupled word line WL2 to determine whether enable the word line WL2 according to the second control signal CTR2. According to an embodiment of the invention, all of the NAND gates and NOT gates (or inverters) in FIG. 7B are coupled to the power voltage DVDD and the ground voltage DVSS.

According to an embodiment of the invention, the control circuit 130 may comprise a plurality of pre-decode circuits to generate the pre-decode signals pda, pdb and pdc. According to an embodiment of the invention, the pre-decode circuits of the control circuit 130 may respectively generate groups of pre-decode signals, herein at least one group of pre-decode signals comprises a clock information. After the pre-decode circuits of the control circuit 130 generate the pre-decode signals, the control circuit 130 may transmit the pre-decode signals to the row decode circuit 120.

Figure 8A:
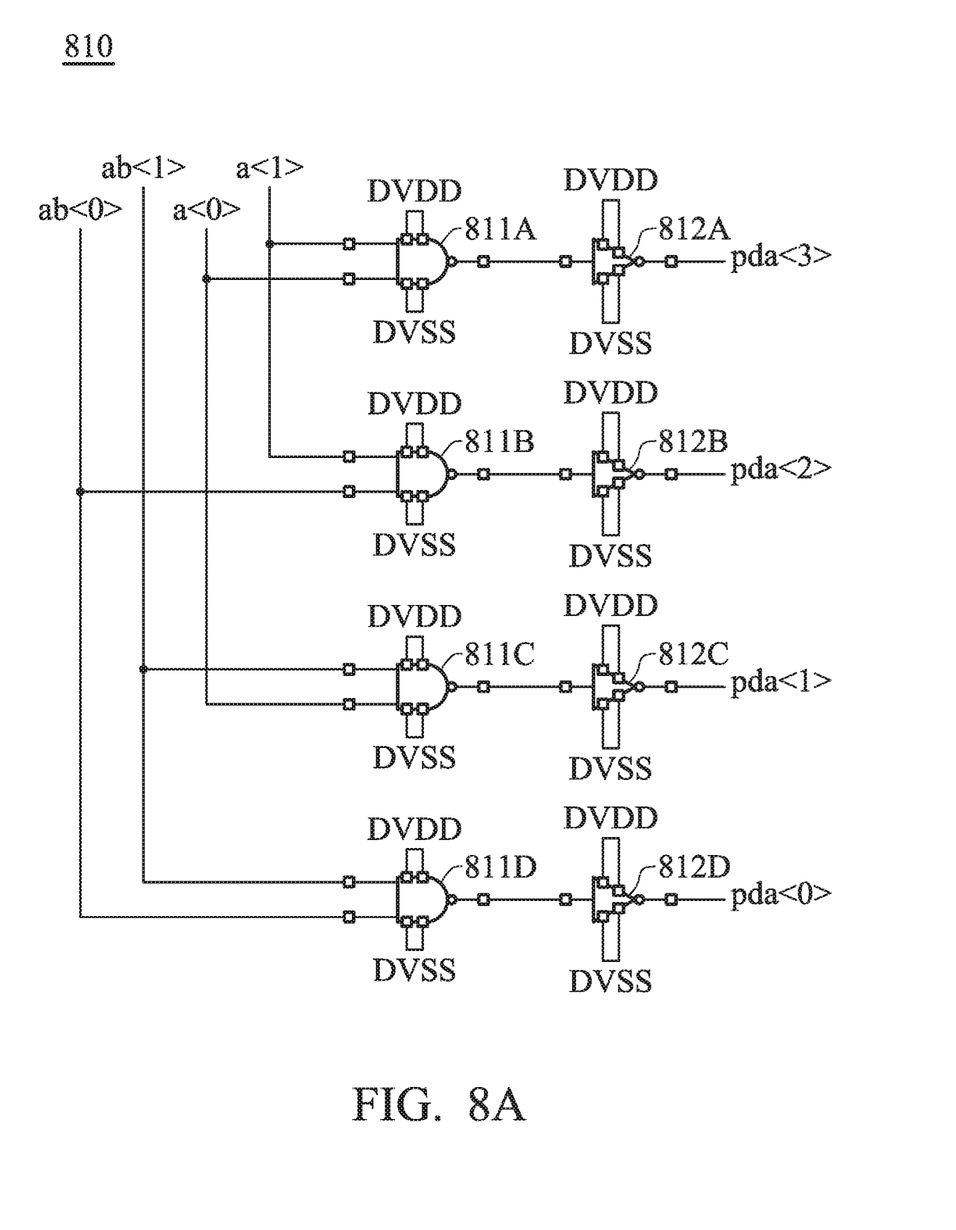
FIG. 8A is a schematic diagram of a pre-decode circuit according to an embodiment of the invention.

FIG. 8A is a schematic diagram of a pre-decode circuit according to an embodiment of the invention. As shown in FIG. 8A the pre-decode circuit 810 comprises NAND gates 811A, 811B, 811C, 811D and NOT gates (or inverters) 812A, 812B, 812C and 812D. The pre-decode circuit 810 receives an input signal a<1:0> and an input signal ab<1:0>, herein the input signal a<1:0> comprises bit signals a<1> and a<0>, the input signal ab<1:0> comprises bit signals ab<1> and ab<0>. The pre-decode circuit 810 performs the pre-decode operation on the bit signals of the input signal a<1:0> and the input signal ab<1:0>, i.e. bit signals a<1>, a<0>, ab<1> and ab<0>, to generate a group of pre-decode signals pda<3:0>, herein the group of pre-decode signals pda<3:0> comprises bit signals pda<3>, pda<2>, pda<1> and pda<0>. The input signal a<1:0> is a two-bits address signal, and the input signal ab<1:0> is the inverted signal of the input signal a<1:0>.

Specifically, the NAND gate 811A receives the bit signals a<1> and a<0>, performs a NAND operation on the bit signals a<1> and a<0> and outputs the operation result to the NOT gate 812A. The NOT gate 812A performs a NOT operation on the operation result of the NAND gate 811A to generate the bit signal pda<3>. The NAND gate 811B receives the bit signals a<1> and ab<0>, performs a NAND operation on the bit signals a<1> and ab<0> and outputs the operation result to the NOT gate 812B. The NOT gate 812B performs a NOT operation on the operation result of the NAND gate 811B to generate the bit signal pda<2>. The NAND gate 811C receives the bit signals a<0> and ab<1>, performs a NAND operation on the bit signals a<0> and ab<1> and outputs the operation result to the NOT gate 812C. The NOT gate 812C performs a NOT operation on the operation result of the NAND gate 811C to generate the bit signal pda<1>. The NAND gate 811D receives the bit signals ab<0> and ab<1>, performs a NAND operation on the bit signals ab<0> and ab<1> and outputs the operation result to the NOT gate 812D. The NOT gate 812D performs a NOT operation on the operation result of the NAND gate 811D to generate the bit signal pda<0>. In an embodiment of the invention, all of the NAND gates and NOT gates (or inverters) in FIG. 8A are coupled to the power voltage DVDD and the ground voltage DVSS.

Figure 8B:
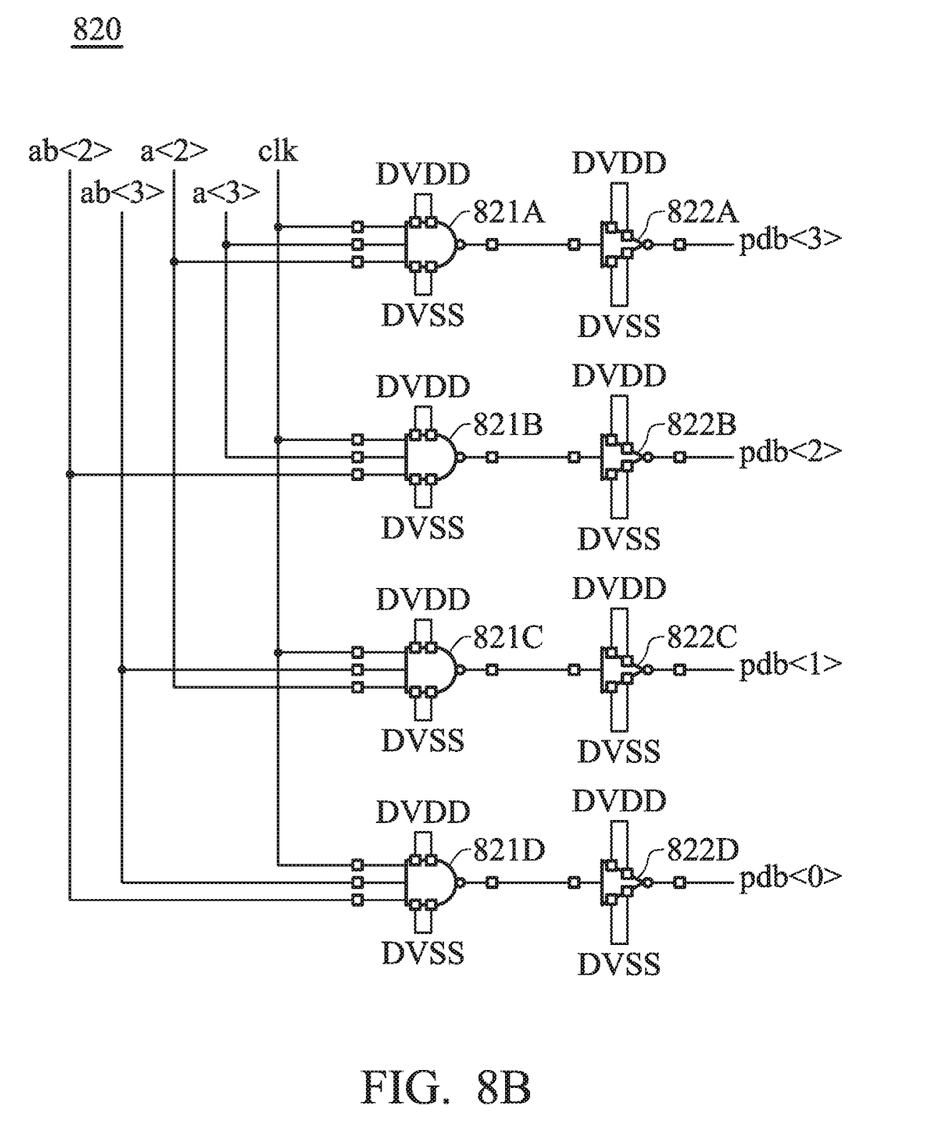
FIG. 8B is a schematic diagram of a pre-decode circuit according to another embodiment of the invention.

FIG. 8B is a schematic diagram of a pre-decode circuit according to another embodiment of the invention. As shown in FIG. 8B, the pre-decode circuit 820 comprises NAND gates 821A, 821B, 821C, 821D and NOT gate (or inverter) 822A, 822B, 822C, 822D. The pre-decode circuit 820 receives an input signal a<3:2>, an input signal ab<3:2> and a clock signal clk, herein the input signal a<3:2> comprises bit signals a<3> and a<2>, the input signal ab<3:2> comprises bit signals ab<3> and ab<2>. The pre-decode circuit 820 performs the pre-decode operation on the bit signals of the input signal a<3:2>, the input signal ab<3:2> and the clock signal clk to generate a group of pre-decode signals pdb<3:0>, herein the group of pre-decode signals pdb<3:0> comprises bit signals pdb<3>, pdb<2>, pdb<1> and pdb<0>. The input signal a<3:2> is a two-bits address signal, and the input signal ab<3:2> is the inverted signal of the input signal a<3:2>. Because the clock signal clk is used in the pre-decode operation of the pre-decode circuit 820, the group of pre-decode signals pda<3:0> comprises the clock information.

Specifically, the NAND gate 821A receives the bit signals a<2>, a<3> and the clock signal clk, performs a NAND operation on the bit signals a<2>, a<3> and the clock signal clk, and outputs the operation result to the NOT gate 822A. The NOT gate 822A performs a NOT operation on the operation result of the NAND gate 821A to generate the bit signal pdb<3>. The NAND gate 821B receives the bit signals a<3>, ab<2> and the clock signal clk, performs a NAND operation on the bit signals a<3>, ab<2> and the clock signal clk, and outputs the operation result to the NOT gate 822B. The NOT gate 822B performs a NOT operation on the operation result of the NAND gate 821B to generate the bit signal pdb<2>. The NAND gate 821C receives the bit signals a<2>, ab<3> and the clock signal clk, performs a NAND operation on the bit signals a<2>, ab<3> and the clock signal clk, and outputs the operation result to the NOT gate 822C. The NOT gate 822C performs a NOT operation on the operation result of the NAND gate 821C to generate the bit signal pdb<1>. The NAND gate 821D receives the bit signals ab<2>, ab<3> and the clock signal clk, performs a NAND operation on the bit signals ab<2>, ab<3> and the clock signal clk, and outputs the operation result to the NOT gate 822D. The NOT gate 822D performs a NOT operation on the operation result of the NAND gate 821D to generate the bit signal pdb<0>. In an embodiment of the invention, all of the NAND gates and NOT gates (or inverters) in FIG. 8B are coupled to the power voltage DVDD and the ground voltage DVSS.

According to an embodiment of the invention, the control circuit 130 may comprise a column selection control circuit to select the multiplexer (MUX) needed to be enabled. According to an embodiment of the invention, the column selection control circuit of the control circuit 130 may generate a column selection signal to select the multiplexer (MUX) needed to be enabled. In addition, the column selection signal generated by the column selection control circuit comprises the clock information. After the control circuit 130 generates the column selection signal, the control circuit 130 may transmit the column selection signal to each input/output interface of the input/output circuit 140. The input/output circuit 140 selects the multiplexer (MUX) needed to be enabled according to the column selection signal.

Figure 9:
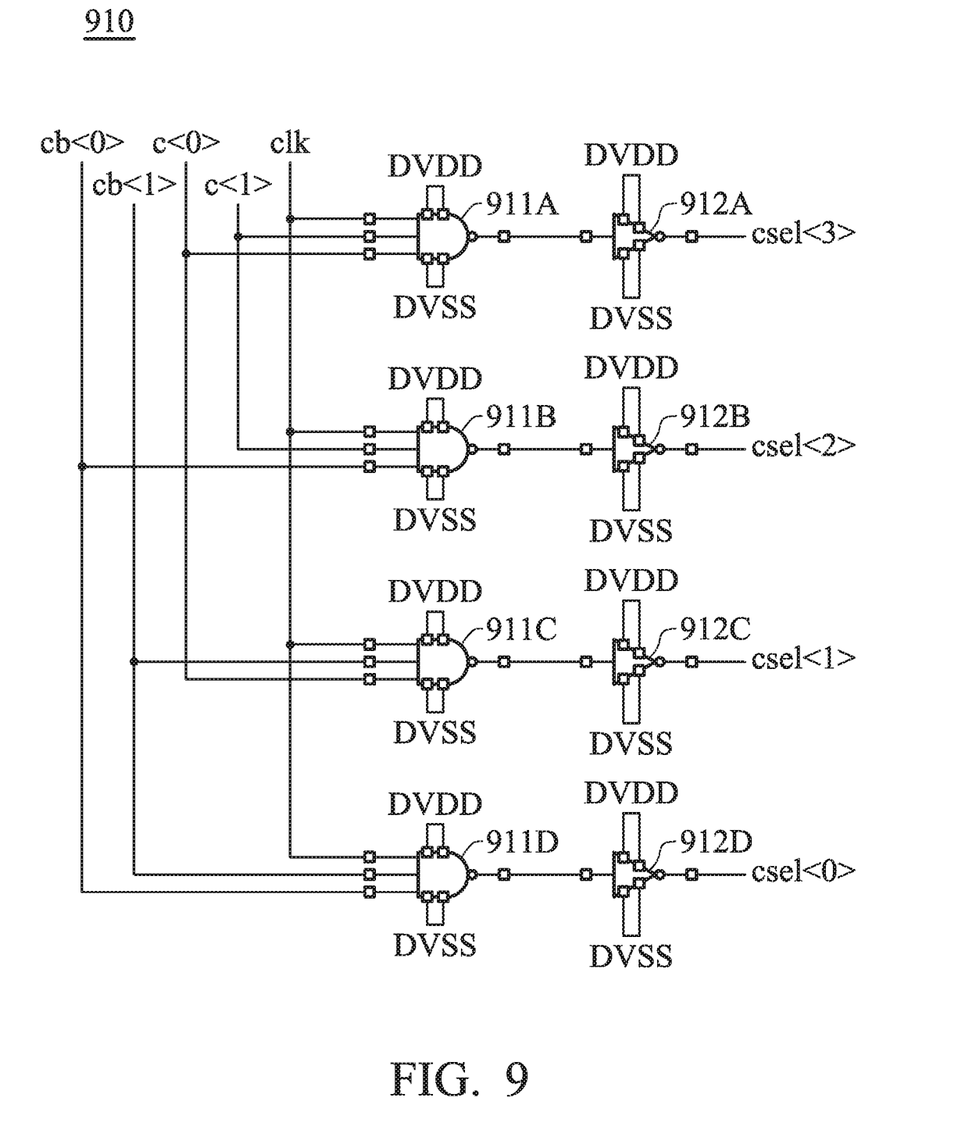
FIG. 9 is schematic diagram of a column selection control circuit according to an embodiment of the invention.

FIG. 9 is schematic diagram of a column selection control circuit according to an embodiment of the invention. As shown in FIG. 9, the column selection control circuit 910 comprises NAND gates 911A, 911B, 911C, 911D and NOT gate (or inverter) 912A, 912B, 912C, 912D. The column selection control circuit 910 receives an input signal c<1:0>, an input signal cb<1:0> and the clock signal clk, herein the input signal c<1:0> comprises bit signals c<1> and c<0>, the input signal cb<1:0> comprises bit signals cb<1> and cb<0>. The column selection control circuit 910 performs the pre-decode operation on the bit signals of the input signal c<1:0>, the input signal cb<1:0> and the clock signal clk to generate a group of column selection control signals csel<3:0>, herein the group of column selection control signals csel<3:0> comprises bit signals csel <3>, csel <2>, csel <1> and csel <0>. The input signal c<1:0> is a two-bits address signal, and the input signal cb<1:0> is the inverted signal of the input signal c<1:0>.

Specifically, the NAND gate 911A receives the bit signals c<0>, c<1> and the clock signal clk, performs a NAND operation on the bit signals c<0>, c<1> and clock signal clk, and outputs the operation result to the NOT gate 912A. The NOT gate 912A performs a NOT operation on the operation result of the NAND gate 911A to generate the bit signal csel<3>. The NAND gate 911B receives the bit signals c<1>, cb<0> and the clock signal clk, performs a NAND operation on the bit signals c<1>, cb<0> and the clock signal clk, and outputs the operation result to the NOT gate 912B. The NOT gate 912B performs a NOT operation on the operation result of the NAND gate 911B to generate the bit signal csel<2>. The NAND gate 911C receives the bit signals c<0>, cb<1> and the clock signal clk, performs a NAND operation on the bit signals c<0>, cb<1> and the clock signal clk, and outputs the operation result to the NOT gate 912C. The NOT gate 912C performs a NOT operation on the operation result of the NAND gate 911C to generate the bit signal csel<1>. The NAND gate 911D receives the bit signals cb<0>, cb<1> and the clock signal clk, performs a NAND operation on the bit signals cb<0>, cb<1> and the clock signal clk, and outputs the operation result to the NOT gate 912D. The NOT gate 912D performs a NOT operation on the operation result of the NAND gate 911D to generate the bit signal csel<0>. In an embodiment of the invention, all of the NAND gates and NOT gates (or inverters) in FIG. 9 are coupled to the power voltage DVDD and the ground voltage DVSS.

The clock signal clk is used in the pre-decode operation of the column selection control circuit 910, so that the column selection control signal csel<3:0> comprises the clock information. The column selection control signal csel<3:0> is transmitted to each input/output interface of the input/output circuit 140 to select or enable the multiplexers of the input/output interface. In each read period or each write period, there is only one bit whose value is 1 in the column selection control signal csel<3:0>, so that only one multiplexer is selected in the input/output interface. From the memory address, e.g. from the address of SRAM, the control circuit 130 selects $\log_2 i$ low bit address signals to be the input signal c of the column selection control circuit 910. In the embodiment, two bits address signal c<1:0> is taken as the input signal c to illustrate how the column selection control signal, e.g. column selection control signal csel<3:0>, is generated according to the address signals and the clock signal. It means that i (i.e. the integer exponent of 2) is 4 and the integer is 2. Each memory block comprises $2^2$ columns of memory cells and each memory block corresponds to 4 multiplexers, but the invention should not be limited thereto. For example, when i=8, each memory block corresponds to 8 multiplexers and 3 bits address signal is used to generate the column selection control signal. According to an embodiment of the invention, the address signal col_addr is selected from the input signal c, e.g. any bit of the input signal c is selected to be the address signal col_addr. According to an embodiment of the invention, from the memory address, e.g. the address of SRAM, other ($\log_2$ M-$\log_2$ i) bits are selected to be the input signal a, such as the input signal a<3:2>, of each pre-decode circuit, wherein M is a integer exponent of 2 larger than and approaching the number of rows m of the memory block or the memory array.

In addition, according to an embodiment of the invention, in order to perform the pre-charge for the bit line BL and inverted bit line /BL, the control circuit 130 may generate the pre-charge signal in advance. The control circuit 130 may output the pre-charge signal to each input/output interface of the input/output circuit 140. After each input/output interface receives the pre-charge signal, all of the bit lines and inverted bit lines in memory array will be charged to the power voltage.

Figure 10:
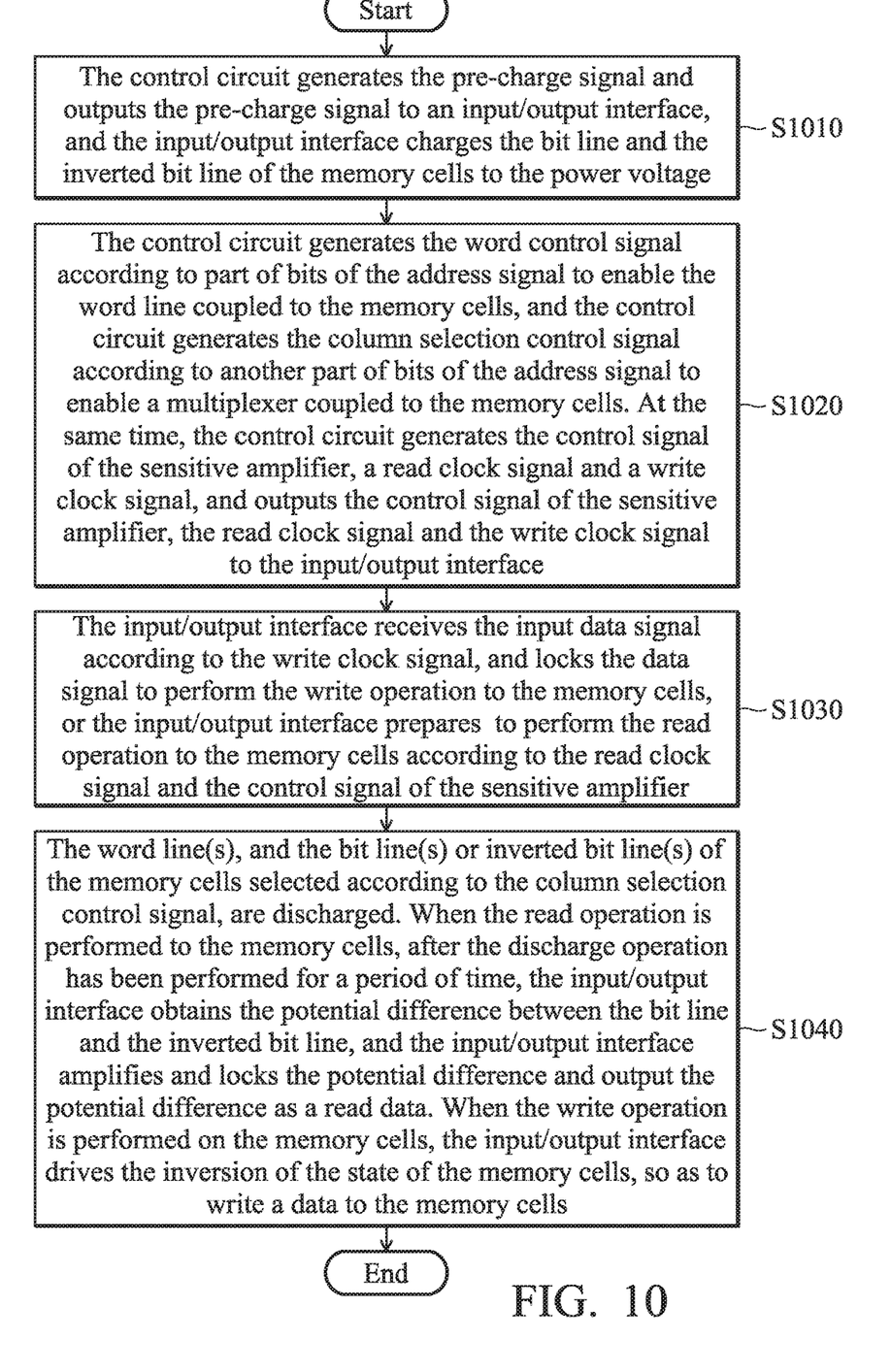
FIG. 10 is a flow chart illustrating operation method of the memory device according to an embodiment of the invention.

FIG. 10 is a flow chart illustrating operation method of the memory device according to an embodiment of the invention. The operation method of the memory device can be applied to all kinds of memory device, e.g. memory device 100. As shown in FIG. 10, in step S1010, the control circuit generates the pre-charge signal and outputs the pre-charge signal to an input/output interface, and the input/output interface charges the bit line and the inverted bit line of the memory cells to the power voltage. In step S1020, the control circuit generates the word control signal according to part of bits of the address signal to enable the word line coupled to the memory cells, and the control circuit generates the column selection control signal according to another part of bits of the address signal to enable a multiplexer coupled to the memory cells. At the same time, the control circuit generates the control signal of the sensitive amplifier, a read clock signal and a write clock signal, and outputs the control signal of the sensitive amplifier, the read clock signal and the write clock signal to the input/output interface. In step S1030, the input/output interface receives the input data signal according to the write clock signal, and locks the data signal to perform the write operation to the memory cells, or the input/output interface prepares to perform the read operation to the memory cells according to the read clock signal and the control signal of the sensitive amplifier. In step S1040, the word line(s), and the bit line(s) or inverted bit line(s) of the memory cells selected according to the column selection control signal, are discharged. When the read operation is performed to the memory cells, after the discharge operation has been performed for a period of time, the input/output interface obtains the potential difference between the bit line and the inverted bit line, and the input/output interface amplifies and locks the potential difference and output the potential difference as a read data. When the write operation is performed on the memory cells, the input/output interface drives the inversion of the state of the memory cells, so as to write a data to the memory cells.

According to the operation method of the memory device provided in the embodiments of the invention, when a read operation or write operation needs to be performed on some memory cells or on a cell in the memory array of the memory device, only the word line corresponding to the memory cells or cell needs to be enabled. Therefore, the power consumption of the memory device will be reduced.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory device, comprising:
a memory block, wherein each memory block comprises:
a plurality of memory cells, wherein a row of memory cells in the memory block are coupled to more than one word lines, and a column of memory cells in the memory block are coupled to a corresponding bit line and a corresponding multiplexer;
a row decode circuit, coupled to the plurality of memory blocks and comprising a plurality of a row decoders, wherein the plurality of row decoders are respectively allocated to the rows of memory cells in the plurality of memory blocks; and
a control circuit, coupled to the row decoder circuit and indicating which word line, bit line and multiplexer are enabled,
wherein the control circuit comprises:
a plurality of pre-decode circuits, wherein each pre-decode circuit generates a group of pre-decode signals and transmits the group of pre-decode signals to the row decode circuit; and
a column selection control circuit, generating a column selection signal based on an input signal of the column selection control circuit and a clock signal to select the multiplexer needed to be enabled,
wherein the input signal of the column selection control circuit is selected based on $\log_2$ i low bit address signals from memory address of the memory device, an address signal output by the control circuit is selected based on the input signal of the column selection control circuit, and an input signal of the pre-decode circuit is selected based on other ($\log_2$ M–$\log_2$ i) address signals from memory address of the memory device, wherein i is an integer exponent of 2 and is regarded as the number of columns of memory cells of each memory block, and M is an integer exponent of 2 larger than and approaching the number of rows of the memory block, wherein each row decoder comprises a plurality of sub decoders which are used to enable the different word lines, and each row decoder further comprises a sub decoder and a NOT gate which are used to enable the plurality of sub decoders used to enable the different word lines, wherein the sub decoder influences a state of two word lines and the NOT gate influences the state of only one of the two word lines, wherein the number of the sub decoders used to enable the different word lines is the same as the number of the word lines configured for the row of memory cells.

2. The memory device of claim 1, wherein each row decoder is coupled to the control circuit to receive the address signal and a plurality of pre-decode signals output by the control circuit, and the row decoder generate a control signal according to the address signal and the plurality of pre-decode signals to enable corresponding one of the word lines.

3. The memory device of claim 1, wherein the pre-decode signal comprises a clock information.

4. The memory device of claim 1, wherein a first memory cell in the row of memory cells is coupled to a first word line and a second memory cell in the row of memory cells is coupled to a second word line.

5. An operation method of memory device, applied to a memory device, wherein a memory block of the memory device comprise a plurality of memory cells, wherein a row of memory cells in the memory block are coupled to more than one word lines, and a column of memory cells in the memory block are coupled to a corresponding bit line and a corresponding multiplexer, comprising:

when a read operation or a write operation needs to be performed to a first memory cell in the row of memory cells, enabling, by a control circuit of the memory device, a first word line coupling to the first memory cell;

discharging, by the control circuit, the bit line coupled to the first memory cell;

selecting, by the control circuit, the multiplexer corresponding to the first memory cell; and performing, by the control circuit, the read operation or the write operation to the first memory cell, wherein the control circuit comprises a plurality of pre-decode circuits, and each pre-decode circuit generates a group of pre-decode signals and transmits the group of pre-decode signals to the row decode circuit, wherein the control circuit comprises a column selection control circuit, wherein the column selection control circuit generates a column selection signal based on an input signal of the column selection control circuit and a clock signal to select the multiplexer needed to be enabled wherein the input signal of the column selection control circuit is selected based on $\log_2$ i low bit address signals from memory address of the memory device, an address signal output by the control circuit is selected based on the input signal of the column selection control circuit, and an input signal of the pre-decode circuit is selected based on other ($\log_2$ M–$\log_2$ i) address signals from memory address of the memory device, wherein i is an integer exponent of 2 and is regarded as the number of columns of memory cells of each memory block, and M is an integer exponent of 2 larger than and approaching the number of rows of the memory block, wherein each row decoder comprises a plurality of sub decoders which are used to enable the different word lines, and each row decoder further comprises a sub decoder and a NOT gate which are used to enable the plurality of sub decoders used to enable the different word lines, wherein the sub decoder influences a state of two word lines and the NOT gate influences the state of only one of the two word lines, wherein the number of the sub decoders used to enable the different word lines is the same as the number of the word lines configured for the row of memory cells.

6. The operation method of the memory device of claim 5, further comprising:

enabling the first word line according to the address signal and a plurality of pre-decode signals through the row decoder.

7. The operation method of the memory device of claim 6, further comprising:

when the read operation or the write operation is performed to a second memory cell in the row of memory cells, enabling a second word line coupling to the second memory cell;

discharging the bit line coupled to the second memory cell;

selecting the multiplexer corresponding to the second memory cell; and performing the read operation or the write operation to the second memory cell.

8. The operation method of the memory device of claim 5, wherein the pre-decode signal comprises a clock information.

* * * * *